US006419148B1

(12) United States Patent
Waxler et al.

(10) Patent No.: US 6,419,148 B1
(45) Date of Patent: Jul. 16, 2002

(54) SYSTEM FOR FORMING BUMPS ON WAFERS

(75) Inventors: Scott Steven Waxler, North Reading, MA (US); Dan Zemer, Rehovot (IL)

(73) Assignee: Orbotech Ltd., Yavne (IL)

( * ) Notice: Subject to any disclaimer, the term of this patent is extended or adjusted under 35 U.S.C. 154(b) by 0 days.

(21) Appl. No.: 09/767,645

(22) Filed: Jan. 23, 2001

(51) Int. Cl.[7] .............................................. B23K 26/00
(52) U.S. Cl. ....................... 228/214; 228/14; 219/121.7
(58) Field of Search .......................... 228/259, 6.1, 6.2, 228/118, 179.1, 180.1, 180.21, 180.22, 188, 189, 214, 14, 13; 219/121.68, 121.69, 121.75, 121.79, 121.7

(56) References Cited

U.S. PATENT DOCUMENTS

| | | |
|---|---|---|
| 5,024,372 A | 6/1991 | Altman et al. ............... 228/248 |
| 5,118,027 A | 6/1992 | Braun et al. ............. 228/180.2 |
| 5,161,257 A | 11/1992 | Arensdorf et al. |
| 5,293,006 A | 3/1994 | Yung ........................... 174/261 |
| 5,323,947 A | 6/1994 | Juskey et al. ............... 228/56.3 |
| 5,447,264 A | 9/1995 | Koopman et al. ............. 28/563 |
| 5,539,153 A | 7/1996 | Schwiebert ................. 174/260 |
| 5,672,542 A | 9/1997 | Schwiebert ................. 437/183 |
| 5,738,269 A | 4/1998 | Masterton ................... 228/248 |
| 5,829,668 A | 11/1998 | George et al. ............... 228/254 |
| 5,938,106 A | 8/1999 | Pierson ....................... 228/246 |
| 5,946,590 A * | 8/1999 | Satoh |
| 6,053,397 A | 4/2000 | Kaminski .................... 228/254 |
| 6,053,398 A | 4/2000 | Iizuka et al. ................. 228/254 |
| 6,056,191 A | 5/2000 | Brouillette et al. ......... 228/254 |
| 6,085,968 A | 7/2000 | Swindlehurst et al. ...... 228/254 |
| 6,093,476 A * | 7/2000 | Horiuchi et al. |
| 6,109,507 A | 8/2000 | Yagi et al. ............. 228/180.22 |

FOREIGN PATENT DOCUMENTS

WO    WO 00/02424    1/2000

OTHER PUBLICATIONS

Analog Devices, "Designing with BGA: Surface Mount Assembly Recommendations for the 2106x Plastic Ball Grid Array (PBGA) Package", 3 pages. (http://www.analog.com/industry/dsp/bga/bgadesig.html) No Date Avail.
Li Li and B. Yeung, "Wafer Level and Flip Chip Design Through Solder Prediction Models and Validation" (Abstract), Motorola Inc., 2000, 2 pages. (http://www.me.gatech.edu/mechatronics2000/Abstracts/245.htm).
J. Titus, "How Do Manufacturers Inspect BGAs?", Test & Measurement World, Feb. 1999, 6 pages. (http://www.tm-world.com/articles/bga_0299.htm).
U.S.S.N. 09/798,160, entitled Scaling and Registration Calibration Especially In Printed Circuit Board Fabrication, filed Nov. 8, 2000.
Fujitsu Tohoku Electronics Ltd., "Design Rule of Solder–Bump (150mm Wafer)", 1997, 2 pages. (http://www.fujitsu.co.jp/hypertext/fte/english/bump_s1.htm).

(List continued on next page.)

*Primary Examiner*—M. Alexander Elve
*Assistant Examiner*—Jonathan Johnson
(74) *Attorney, Agent, or Firm*—Ladas & Parry

(57) ABSTRACT

A system and method for forming bumps on an integrated circuit including a scanning direct laser imager employed to selectably expose a photosensitive layer deposited on an integrated circuit substrate, thereby to define regions overlying selected portions of the substrate, a developer developing said photosensitive layer to form apertures in the photosensitive layer at the defined regions, and a solder applicator applying a solder composition to the apertures to define solder bumps on the integrated circuit at selected portions thereof.

12 Claims, 5 Drawing Sheets

OTHER PUBLICATIONS

J. Franka et al., "Tap Resource: Solder Bump Technology: Present and Future", Semiconductorfabtech.com, 10 pages. No Date Avail. (http://www.semiconductorfabtech.com/features/tap/articles/02.289.html).

Karl Suss, "Photolithography for Thin Film MCMs", 5 pages. (http://194.174.202.134/sitemap/photolith_thin_film.htm) No Date Avail.

Research International Chipflo Ovens, "ChipFlo Series: BGA Solder Ball Attachment Convection Ovens", 3 pages. No Date Avail. (http://www.research-intl.com/products/chipflo.html).

Orbotech, "Automated Optical Inspection Solutions", 2 pages. (http://www.orbotech.com/products/pcb/aoi,html) No Date Avail.

Cognex, "BGA II Inspection Package: Machine Vision for Inspecting Ball Grid Arrays", 2000, 3 pages. (http://www.cognex.com/marketing/products/prod_bga.asp).

G.E. McGuire, "Development of Liftoff Process for Patterning of Magnetic and other Materials", MCNC, 4 pages. No Date Avail (http://www.phys.ulf.edu/~nanoscale/reports/yearl/liftoff.html).

UW–MEMS–DXRL Micromachining, "Deep X-Ray Lithography and Electrodeposition Micromachining", 4 pages. No Date Avail (http://www.mems.engr.wisc.edu/DXRL.html).

R. Leitgeb, "Photolithography", Sep. 29, 1998, one page. (http://www.-rpl.stanford.edu/RPL/htmls/mesoscopic/processes/photolithography.html).

"Positive and Negative Photoresist", one page. No Date Avail (http://www.ece.gatech.edu/research/lab/vc/theory/PosNegRes.html).

Chipscale Review, "Effects of Print Parameters", Jul.–Aug. 1999, 10 pages. (http://www.chipscalereview.com/chipscalen2/9907/rechforums3.htm).

"Chapter E: Ball Grid Array Techn.", 8 pages. No Date Avail (http://extra/ivf.se/ngl/E–BGA/ChapterE2,htm).

R.H. Estes, "Technology Trends: Solderless Polymer Bump Process For Flip Chips", U.S. Tech Interactive, 1996, 6 pages. No Date Avail (http://www.us-tech.com/sept96/spftrspftr002.htm).

J. Baliga, "Ball Grid Arrays: The High Pincount Workhorse", Semiconductor International, Sep. 1999, 6 pages. (http://209.67.253.149/semiconductor/issues/issues/1999/sep99/docs/feature2.asp).

"Design and Assembly Process Implementation for BGAs", Working Draft, IPC–7095, *IPC*, Apr. 1999, 105 pages.

N.C. Lee, "The Use of Solder as an Area–Array Package Interconnect",Chipscale Review, Sep.–Oct. 1999, 8 pages. (http://www.chipscalereview.com/chipscalen2/9910/featured1.htm).

* cited by examiner

TO FIG. 2B

SYSTEM FOR FORMING BUMPS ON WAFERS

FIELD OF THE INVENTION

The present invention relates generally to methods and systems employed in the manufacture of electrical circuits and more particularly to the use of direct laser imaging for forming solder bumps on integrated circuit substrates.

BACKGROUND OF THE INVENTION

A known method for connecting integrated circuits to printed circuit board employs so-called "flip-chip" technology. An electrical circuit is formed on one side of an integrated circuit substrate, and solder bump contacts are formed on a layer overlaying the electrical circuit. The integrated circuit substrate is placed face down onto an interconnect, such as a multi-chip module or BGA substrate, so that the solder bump contacts are in registered contact with an array of contacts, such as surface mount pads, formed on the interconnect. The substrate and printed circuit board are heated to melt the solder and establish electrical connect between the integrated circuit and the interconnect.

The following U.S. Patents are considered relevant to the art of solder bump preparation: U.S. Pat. No. 5,024,372 to Altman et al; U.S. Pat. No. 5,118,027 to Braun et al.; U.S. Pat. No. 5,161,257 to Yung; U.S. Pat. No. 5,293,006 to Yung; U.S. Pat. No. 5,323,947 to Juskey et al.; U.S. Pat. No. 5,447,264 to Koopman et al.; U.S. Pat. No. 5,539,153 to Schwiebert; U.S. Pat. No. 5,672,542 to Schwiebert; U.S. Pat. No. 5,738,269 to Masterton; U.S. Pat. No. 5,829,668 to George et al.; U.S. Pat. No. 5,938,106 to Pierson; U.S. Pat. No. 6,053,397 to Kaminski; U.S. Pat. No. 6,053,398 to Iizuka et al.; U.S. Pat. No. 6,056,191 to Brouillette et al.; U.S. Pat. No. 6,085,968 to Swindlehurst et al.; U.S. Pat. No. 6,109,507 to Yagi et al.

SUMMARY OF THE INVENTION

The present invention seeks to provide improved apparatus and methods for forming high density solder bumps on semiconductor substrates.

There is thus provided in accordance with a preferred embodiment of the present invention a method for forming bumps on an integrated circuit comprising employing a scanning direct laser imager to selectably expose a photosensitive layer deposited on an integrated circuit substrate thereby to define regions overlying selected portions of the integrated circuit substrate; developing the photosensitive layer thereby to selectively remove the photosensitive layer at the regions; and applying a solder composition to the predetermined regions, thereby to define solder bumps overlying the selected portions of the integrated circuit substrate.

Preferably the photosensitive layer is a solder mask.

Preferably the exposed regions have a spatial density which exceeds a spatial density which is realizable using an exposure mask.

Alternatively and additionally the exposed regions of photoresist preferably produce apertures having walls whose perpendicularity to a surface of the integrated circuit substrate exceeds the perpendicularity which is realizable using an exposure mask.

Moreover, in accordance with a preferred embodiment of the invention the employing a scanning laser direct imager, developing the photosensitive layer, and applying a solder composition take place waferwise prior to dicing of the integrated circuit substrate into individual dies.

Preferably, the electrical circuit is an integrated circuit and the substrate comprises a semiconductor substrate.

Additionally, in accordance with a preferred embodiment of the invention metal bases, providing an underbump metalization, are formed to overlay selected portions of the integrated circuit substrate, and the regions exposed in the photosensitive layer overly the bases.

Preferably the metal bases are formed by depositing a metal layer on the substrate; coating the metal layer with a photoresist; selectively exposing the photoresist to define a multiplicity of locations on the photoresist; developing the exposed photoresist and removing the photoresist other than at predetermined locations, thereby to expose the metal layer other than at the predetermined locations; and etching the metal layer to remove the metal layer other than at the predetermined locations to define a multiplicity of metal bases formed on the substrate.

Preferably, the substrate and the metal bases thereon are both coated with a layer of photosensitive solder mask used in the format on of solder bumps.

There is thus provided in accordance with a preferred embodiment of the present invention a system for forming bumps on an integrated circuit comprising a scanning laser direct imager selectably exposing a photosensitive layer deposited on an integrated circuit substrate thereby to define regions in the photosensitive layer overlying selected portions of the integrated circuit substrate; a developer developing the photosensitive layer to selectively remove the photosensitive layer at the defined regions; and a solder applicator applying a solder composition to the defined regions, thereby to define bumps overlying the selected portions of the integrated circuit substrate.

Preferably the photosensitive layer is a solder mask.

Preferably the direct laser imager defines exposed regions having a spatial density which exceeds a spatial density which is realizable using an exposure mask.

Alternatively and additionally the direct laser imager preferably defines exposed regions of the photosensitive layer to produce apertures having walls whose perpendicularity to a surface of the integrated circuit substrate exceeds the perpendicularity which is realizable using an exposure mask.

Preferably the developer and the solder applicator operate waferwise prior to doing of the integrated circuit substrate into individual dies.

Preferably the electrical circuit comprises an integrated circuit and the substrate comprises a semiconductor substrate.

In accordance with a preferred embodiment of the invention, the system for forming bumps on an integrated circuit substrate includes: a laser emitting laser light; a modulator receiving the laser light and modulating the laser light in accordance with control data received from a controller; and a polygonal mirror receiving the modulated laser and scanning the modulated laser light to expose the photoresist in a predetermined pattern.

Preferably the system further includes a metal base applier applying metal bases overlying selected portions of the integrated circuit substrate and wherein the regions overly the bases.

Preferably the metal base applier includes: a metal layer depositer depositing a metal layer on the substrate; a photoresist coater coating the metal layer with a photoresist; a laser direct imaging system selectively exposing the photoresist to define a multiplicity of locations; a developer developing the exposed photoresist and removing the photoresist other than at the locations, thereby to expose the metal layer other than at the locations; and an etcher removing the metal layer other than at the locations to define a multiplicity of metal bases formed on the substrate.

Preferably the system further includes a photosensitive layer coater coating the substrate and the metal bases thereon with a layer of photosensitive solder mask.

In accordance with a preferred embodiment of the invention, the system includes a laser emitting laser light; a modulator receiving the laser light and modulating the laser light in accordance with control data received from a controller; and a polygonal mirror receiving the modulated laser and scanning the modulated laser light to expose the photoresist in a predetermined pattern.

There is thus provided in accordance with a preferred embodiment of the invention a method for forming bumps on an integrated circuit, comprising: exposing a first photosensitive layer deposited on an integrated circuit substrate thereby to define regions in the photosensitive layer overlying selected portions of the integrated circuit substrate; applying a second photosensitive coating to the integrated circuit substrate; employing a scanning laser direct imaging system to expose the second photosensitive coating to define apertures in the second photosensitive coating generally overlying the portions; processing the second photosensitive coating to form apertures therein; and applying a solder composition to the apertures to form bumps. Preferably the bumps overly the selected portions of the integrated circuit.

There is thus provided in accordance with another preferred embodiment of the present invention a method for forming a portion of an electrical circuit on an integrated circuit substrate comprising: loading a first integrated circuit substrate and at least a second integrated circuit substrate onto a laser pattern exposure system; and exposing a selected portion of a photosensitive layer deposited on the second integrated circuit substrate prior to completing an exposure sequence exposing part of an electrical circuit pattern to be formed on a photosensitive layer deposited on the first integrated circuit substrate.

There is thus provided in accordance with still another preferred embodiment of the present invention a method for forming a portion of an electrical circuit on an integrated circuit substrate comprising: loading an integrated circuit substrate onto a laser pattern exposure system, wherein the substrate has formed on a surface thereof at least part of an integrated circuit pattern and a fiducial pattern having a known geometry with reference to the integrated circuit pattern, and the substrate is at least partially coated with a photosensitive coating; ascertaining the location of the fiducial pattern; adjusting digital data representing a portion of an electrical circuit to be formed on the integrated circuit substrate according the location of the fiducial pattern; and exposing a selected portion of the photosensitive layer with a laser beam according to a pattern supplied by the adjusted digital data.

BRIEF DESCRIPTION OF THE DRAWINGS

The present invention will be understood and appreciated more fully from the following detailed description, taken in conjunction with the drawings in which.

DETAILED DESCRIPTION OF A PREFERRED EMBODIMENT

Figure 1A:
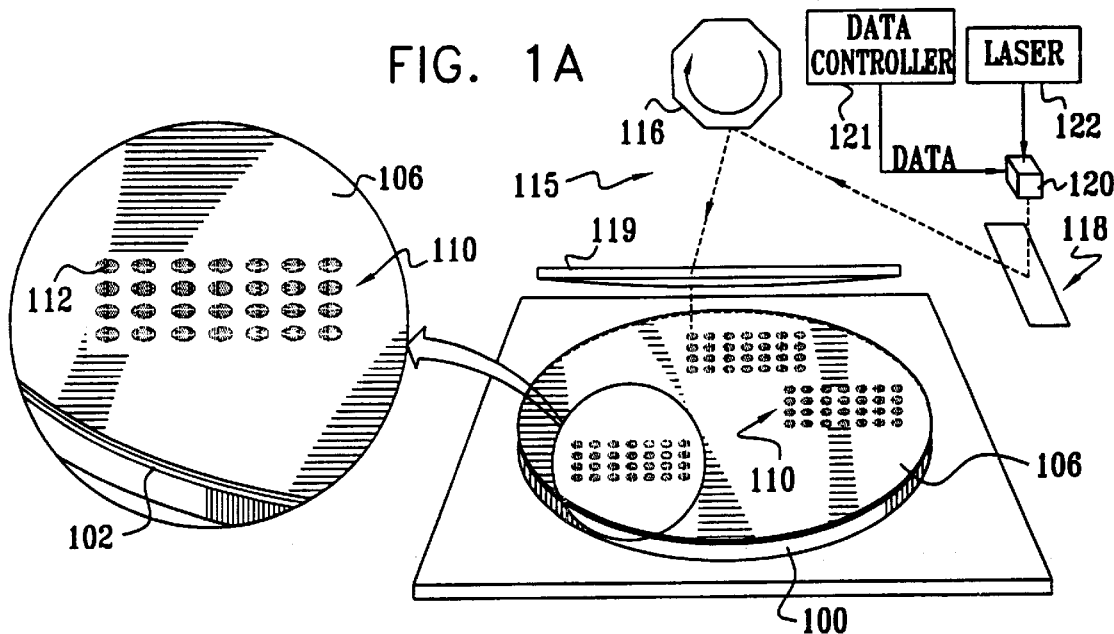
FIGS. 1A, 1B, 1C, 1D, 1E, 1F, 1G & 1H are simplified pictorial illustrations illustrating various stages in a methodology for waferwise formation of solder bumps on an integrated circuit in accordance with a preferred embodiment of the present invention.
Figure 1B:
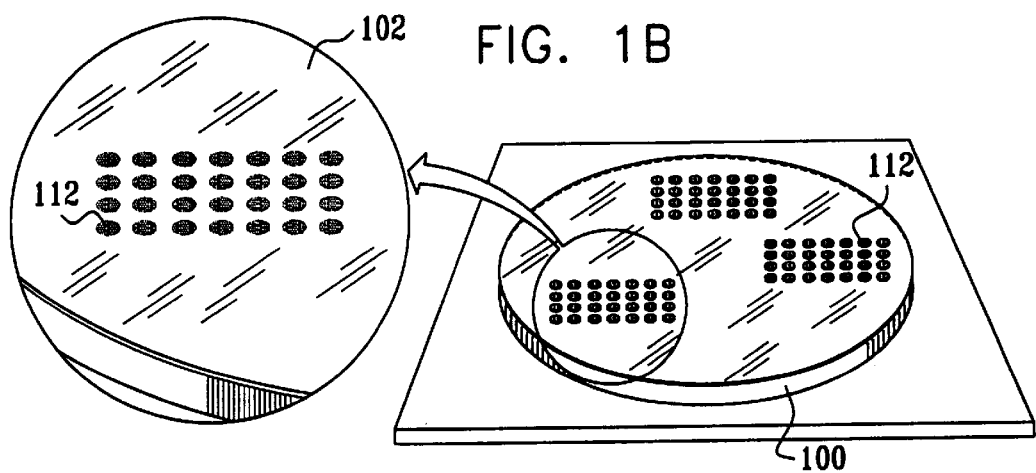
Figure 1C:
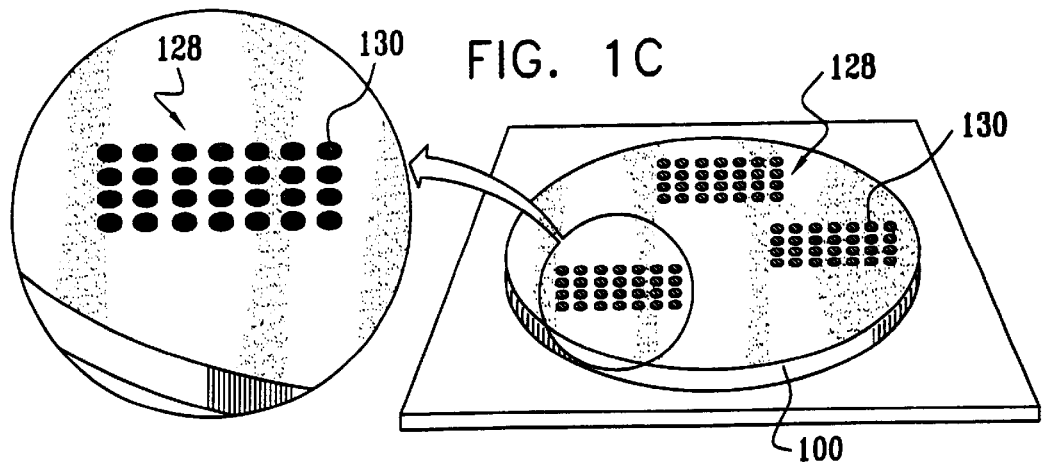
Figure 1D:
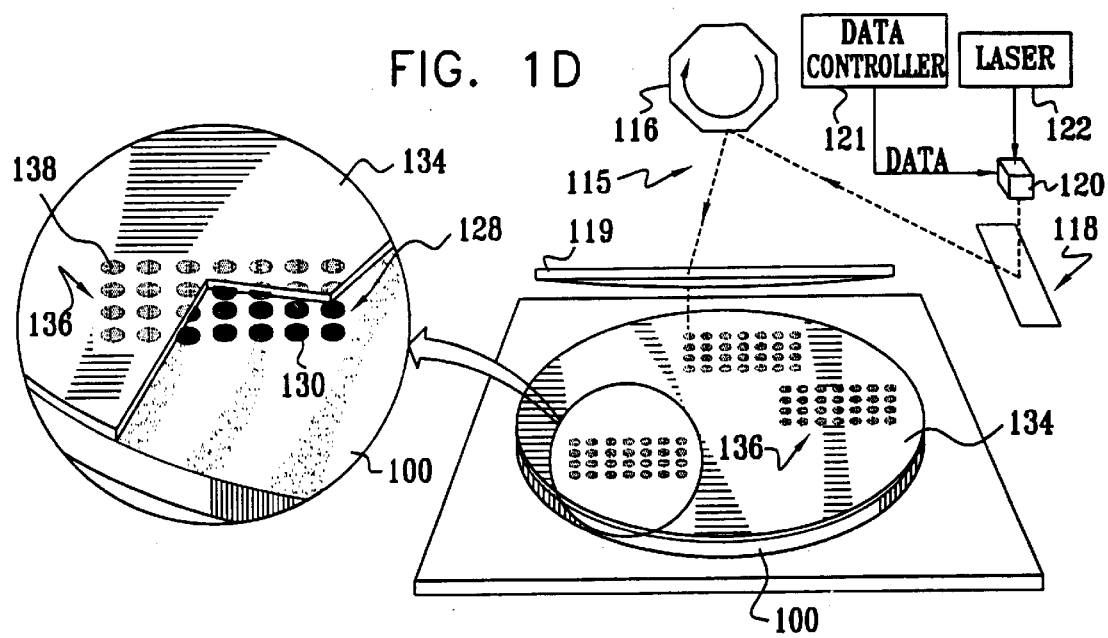
Figure 1E:
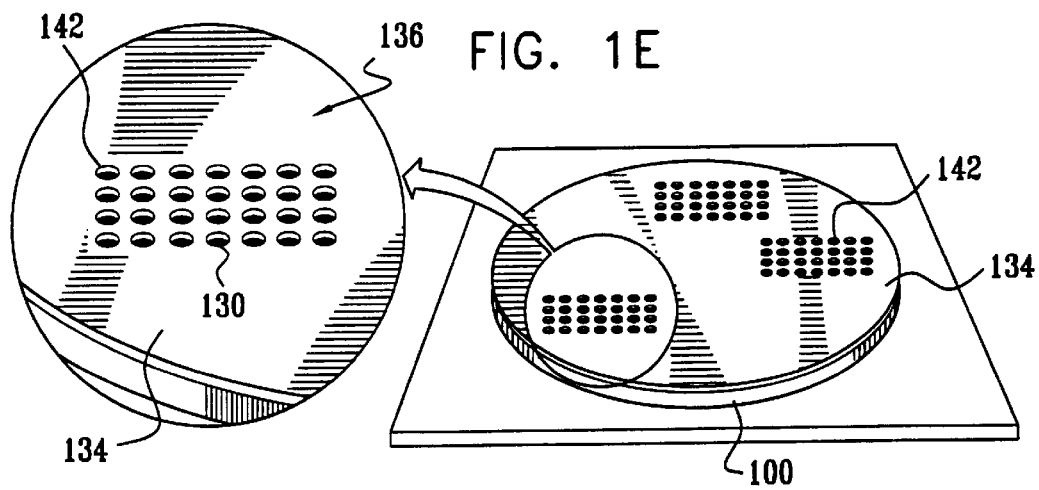
Figure 1F:
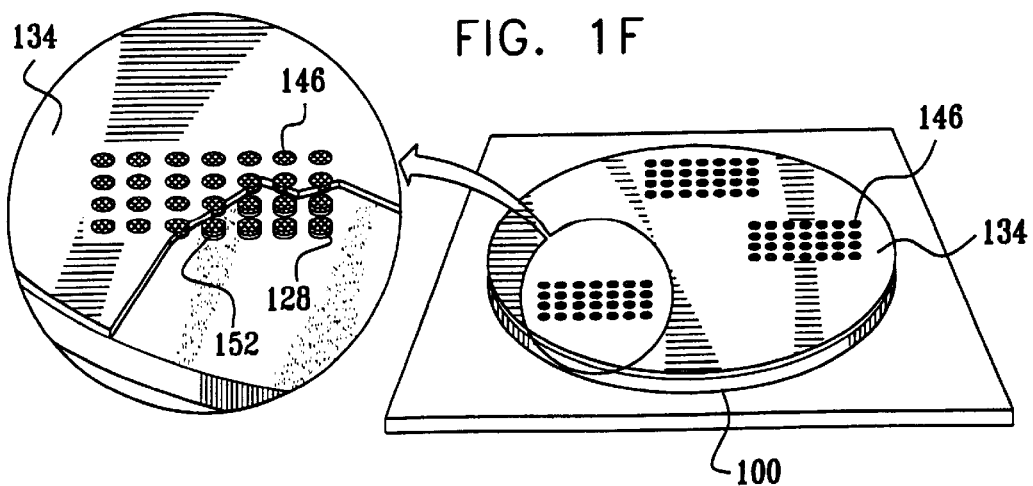
Figure 1G:
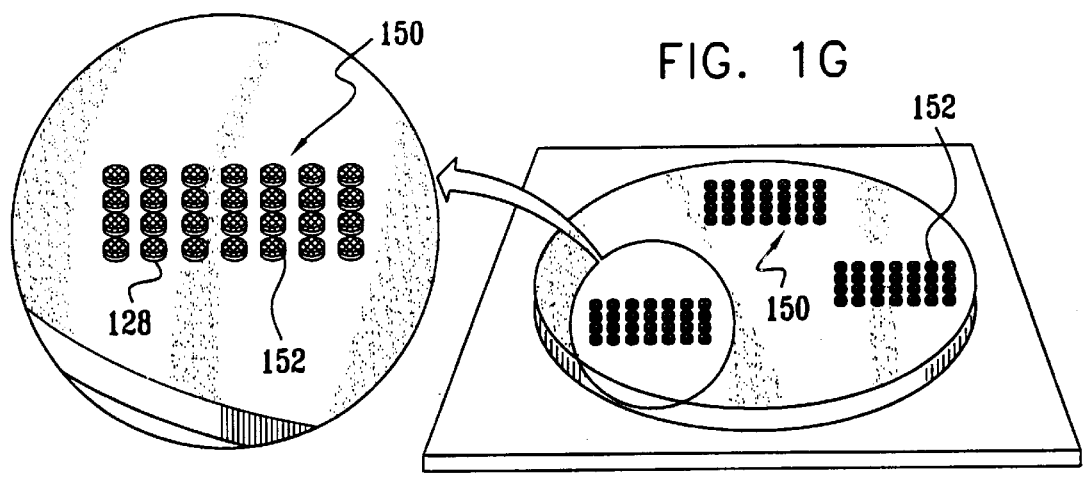
Figure 1H:
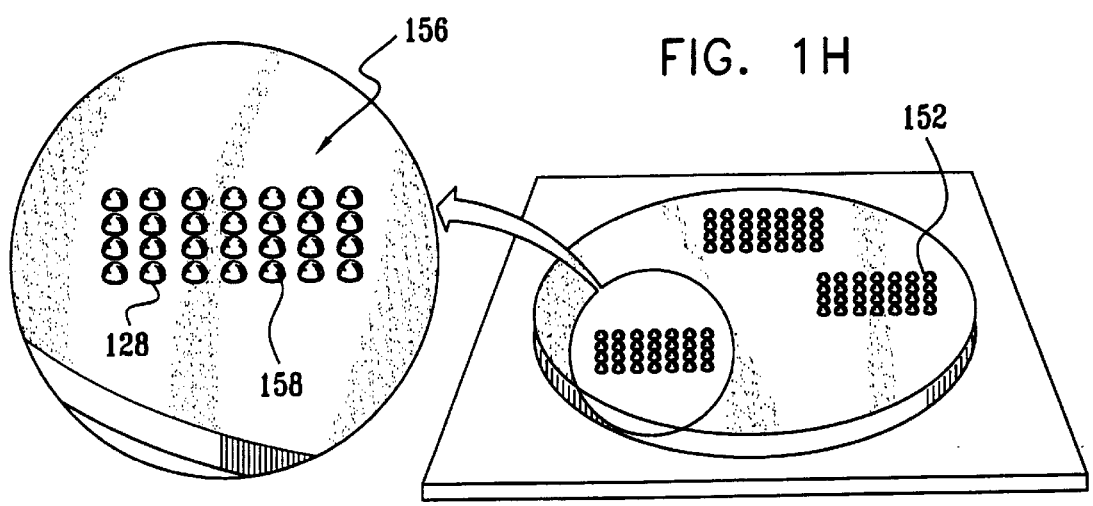
Figure 2A:
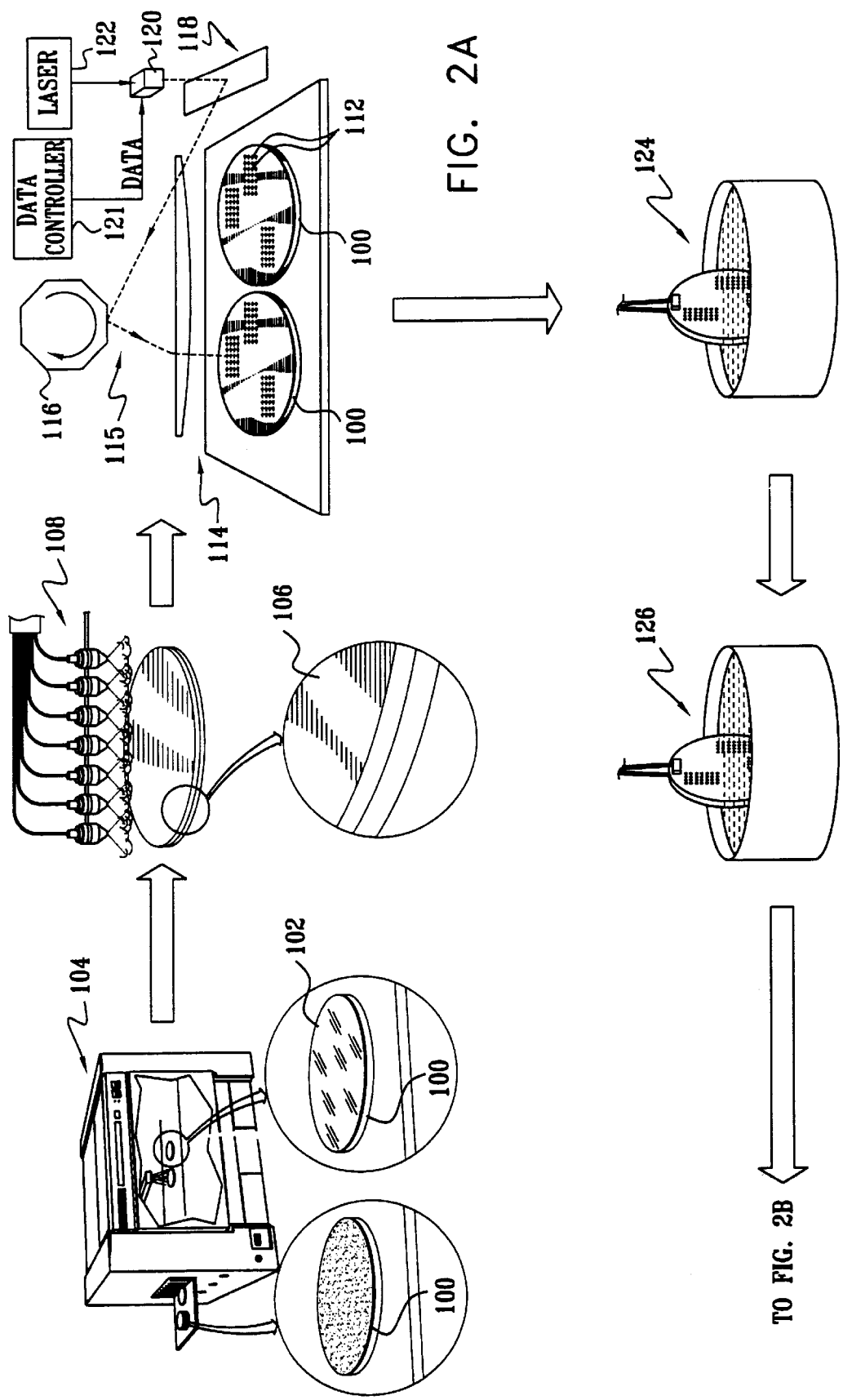
FIGS. 2A and 2B are together a simplified pictorial illustration of various process steps employed in the methodology of FIGS. 1A–1H.
Figure 2B:
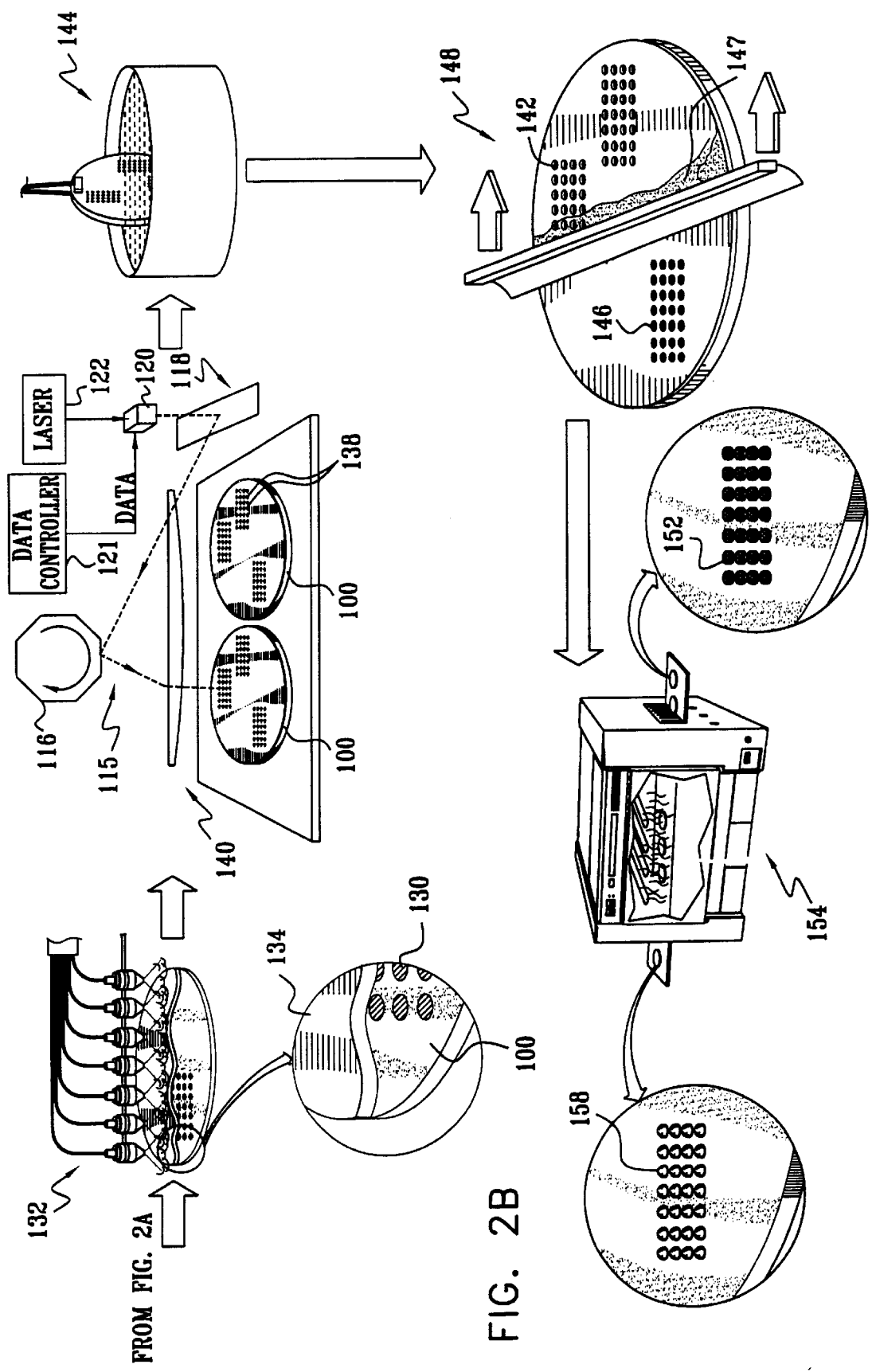

Reference is now made to FIGS. 1A, 1B, 1C, 1D, 1E, 1F, 1G & 1H which are simplified pictorial illustrations illustrating various stages in a methodology for waferwise formation of solder bumps on an integrated circuit in accordance with a preferred embodiment of the present invention and to FIGS. 2A and 2B, which are together a simplified pictorial illustration of various process steps employed in the methodology of FIGS. 1A–1G.

As seen in FIG. 2A, a conventional silicon wafer 100, coated with a metallic base layer 102, as by sputtering or any other suitable technique, and formed of copper and/or chromium and/or nickel and/or other suitable material, shown at reference numeral 104 in FIG. 2A, is further coated with a layer 106 of suitable photoresist, as shown at reference numeral 108 in FIG. 2A. The photoresist layer 106 is exposed, preferably by laser direct imaging thereon to define an array 110 of solder bump locations 112, as shown at reference numeral 114. Solder bump locations 112 are positioned at predetermined selected portions of wafer 100 so that solder bumps formed at solder bumb locations 112 are in communication with an electrical circuit formed on wafer 100. It is appreciated that other conventional systems, for example steppers in combination with stencil masks or reticules, may be employed to expose photoresist layer 106 and define array 110.

As seen particularly in FIG. 1A, the exposure of the photoresist layer 106 on wafer 100 preferably is carried out using a scanning laser direct imaging system 115, preferably employing a polygonal mirror 116, which receives suitably modulated laser light via suitable optics 118, typically including a substantially telecentric scan lens 119, from a modulator 120. Modulator 120 is operative to data modulate light received from a laser 122 in accordance with control data received from a controller 121. The control data preferably is digital data representing a pattern of bump locations 112 to be imaged onto photoresist layer 106.

It is also seen at reference numeral 114 in FIG. 2A that patterns may be exposed on two wafers simultaneously, such that exposure of a selected portion of the photosensitive layer 106 deposited on one of the wafers may be commenced prior to completing an exposure sequence to expose an electrical circuit pattern to be formed on the photosensitive layer deposited the other wafer. Depending on the relative size of wafers 100 and the capacity of scanning laser direct imaging system 115, more than two wafers may be exposed simultaneously.

It is to be noted that the arrays 110 of solder bump locations 112, as well as the relative sizes of wafer 100 and laser direct imaging system 115, are not shown to scale in FIGS. 1A–2B out of considerations of clarity. Arrays 110 typically are in fact substantially smaller than shown, and may be distributed evenly, or not evenly, over substrate 100 in correlation to the location of integrated circuits formed on wafer 100.

Referring now to FIG. 1B, it is seen that following the exposure step of FIG. 1A, the photoresist layer 106 is developed to remove layer 106 other than at the solder bump locations 112. This developing stage is shown in FIG. 2A at reference numeral 124.

Following stage 124 shown in FIG. 2A, and also seen at FIG. 1B, the exposed base layer 102, not covered by the photoresist layer 106, which is only present at the bump locations 112, is etched away, as shown in FIG. 2A at reference numeral 126 and thereafter, the remaining photoresist layer 106 is stripped, to leave an array 128 of disks 130. Each disk 130 preferably forms an underbump metalization for a subsequently deposited solder bump, and each disk 130 overlays a bump location 112, as shown in FIG. 1C, corresponding to an appropriate location in an electrical circuit formed on wafer 100. It is appreciated that a preferred method for generating array 128 of disks 130, which typically are required to facilitate bonding of bumps to silicon wafer 100, includes a photolithography process employing a scanning laser direct imaging system as described hereinabove. Nevertheless, disks 130 may be formed using any other suitable process, for example direct deposit through stencils or a photolithography process employing a stepper and a suitable stencil mask or reticule.

As seen in FIG. 1D and at reference numeral 132 in FIG. 2B, a further photosensitive layer 134, such as a layer of photosensitive solder mask, is evenly deposited over the exposed wafer 100 and over the array 128 of disks 130, which corresponds to array 110 of bump locations 112.

It is a feature of the present invention that the photosensitive solder mask layer 134 is then exposed, preferably by laser direct imaging thereon, preferably employing system 115, to define an array 136 of aperture locations 138 in the photosensitive layer 134, each in registration with a corresponding solder bump location 112. It is appreciated that registration of aperture locations 138 needs to be very accurate.

A suitable technique for providing mutual registration of aperture locations 138, bump locations 112, and locations in an electrical circuit deposited on wafer 100 includes acquiring an image of a pattern formed of one or more fiducial markings (not shown) on wafer 100, for example with a CCD sensor (not shown) and ascertaining the location of the fiducial patterns. Digital data representing a pattern to be exposed on the surface of wafer 100 is dynamically aligned, and as necessary scaled and stretched, with reference to the pattern of fiducial markings, in order to pattern fit the locations to be recorded by system 115 to actual locations on wafer 100. It is appreciated that in such a system the pattern of fiducial markings has a known geometry with reference to an electrical circuit pattern.

A preferred method for precisely calibrating sensors employed to image fiducials and ascertain their location, used in registration and alignment in a scanning laser direct imaging system, is described in Applicant's copending U.S. patent application Ser. No. 09/798,160. A preferred method for dynamically scaling data in a scanning laser direct imaging system is described in Applicant's published PCT patent application WO/0002424. The disclosures of these references are incorporated herein by reference.

As seen particularly in FIG. 1D and a reference numeral 140 in FIG. 2B, the exposure of the photoresist layer 134 on wafer 100 is preferably carried out using a scanning laser direct imaging system 115, which may be identical to the system employed for exposing photoresist layer 106 (FIG. 1A), preferably employing a polygonal mirror 116, which receives suitably data modulated laser light via suitable optics 118, typically including a telecentric scan lens 119, from a modulator 120. Modulator 120 is operative to modulate light received from a laser 122 in accordance with control data received from a controller 121.

It is also seen in FIG. 2B that patterns may be exposed on two wafers simultaneously, such that exposure of a selected portion of the photosensitive layer deposited on one of the wafers may be exposed prior to completing an exposure sequence to expose an electrical circuit pattern to be formed on the photosensitive layer deposited the other wafer. Depending on the relative size of wafers 100 and the capacity of scanning laser direct imaging system 115 more than two wafers may be exposed simultaneously.

Referring now to FIG. 1E, it is seen that following the exposure step of FIG. 1D, the photosensitive layer 134 is developed to selectively remove photosensitive layer 134 at the aperture locations 138 which are in registration with the disks 130 providing an underbump metalization and located at the solder bump locations 112 (FIG. 1A), thereby providing apertures 142. This developing stage is shown in FIG. 2B at reference numeral 144.

It is appreciated that scanning laser direct imaging system 115 typically employs highly telecentric optics, such as scan lens 119, and a highly collimated focused laser beam to expose the photosensitive solder mask in a dense raster pattern. Consequently, the inventors believe that scanning laser direct imaging system 115 is capable of producing apertures 142 in the solder mask 134 whose walls have a perpendicularity to a surface of the integrated circuit substrate (wafer 100) that exceeds the perpendicularity that is realizable using exposure masks and reticules in a conventional solder mask exposure system, such as with a stepper.

Moreover, the inventors believe that a scanning laser direct imaging system 115 is able to produce arrays 136 of apertures 142 that have a Spatial density that exceeds the spatial density realizable using exposure masks and reticules to expose solder mask 134 in a conventional solder mask exposure system, such as with a stepper Following the stage shown in FIG. 1E, the apertures 142 are filled with a precise volume of a solder compound 146, for example in the form of a solder paste 147, as shown in FIG. 1F and at reference numeral 148 in FIG. 2B. Solder compound 146 may be a conventional composition of tin and/or lead solder, or may include gold or any other metal suitable for establishing a bonding electrical contact between an integrated circuit and a carrier substrate.

Thereafter, the remaining photosensitive layer 134 is stripped, for example by washing away the solder mask, to leave an array 150 of solder deposits 152, each overlying a corresponding disk 128 at a bump location 112, as shown in FIG. 1G.

As a final stage, the array 150 of solder deposits 152 may be subjected to reflow, for example by any suitable processes such as sonic vibration or heating, as shown at reference numeral 154 in FIG. 2B, thereby to define an array 156 of solder bumps 158, each having a generally predeteremined uniform shape and precise volume, in registration with disks 128 at respective bump locations 112 (FIG. 1A).

It is a particular feature of the present invention that the exposure functionality of exposing photosensitive solder mask layer 134, and preferably additionally photoresist layer 106, employed in the present invention may be carried out by a laser direct imaging raster scanning system. Such systems, employed in the generation of conductor patterns on printed circuit boards, are commercially available from the present assignee, Orbotech Ltd. of Yavne, Israel under the model designation DP-100, and may be suitably adapted to accommodate the exposure of silicon wafers 100.

The inventors believe that the use of such laser direct imaging raster scanning systems offer several advantages including: the option of using the large bed of a laser direct imaging raster scanning system (typically at least 24" wide)

to simultaneously expose several wafers; on-the-fly scaling of exposure patterns to be recorded, preferably provided by digital exposure data, on any of the photosensitive surfaces deposited on wafer 100, recordation of different exposure patterns, forming different structures of arrays 156, at different regions along the surface of wafer 100; recordation of exposure patterns on wafer 100 without the use of masks; recordation of exposure patterns on wafer 100 directly from digital data representing a pattern of bump locations or aperture locations to be exposed.

It is appreciated that the waferwise formation of solder bumps described hereinabove may take place prior to, subsequent to or any any suitable stage with respect to formation of integrated circuits on a given wafer. Preferably, the formation of bumps takes place prior to dicing a wafer into individual dies. Moreover solder bumps may be formed on the same side and same layer of a wafer as an integrated circuit formed thereon (the front end) or on the same side of the wafer but on a different layer than an integrated circuit formed thereon (the back end), or on an opposite side of the wafer altogether. It is also appreciated that aspects of the present invention may be applicable to non-waferwise formation of solder bumps.

It is appreciated by persons skilled in the art that the present invention is not limited by what has been particularly shown and described hereinabove. Rather the present invention includes modifications and variations thereof which would occur to a person of skill in the art upon reading the foregoing description and which are not in the prior art.

What is claimed is:

1. A system for forming bumps on an integrated circuit, comprising:
    a scanning laser direct imager selectably exposing a photosensitive layer deposited on an integrated circuit substrate thereby to define regions in said photosensitive layer overlying. selected portions of said integrated circuit substrate;
    a developer developing said photosensitive layer thereby to selectively remove the photosensitive layer at said regions; and
    a solder applicator applying a solder composition to said predetermined regions, thereby to define bumps overlying said selected portions of said integrated circuit substrate.

2. A system for forming bumps on an integrated circuit substrate according to claim 1 wherein said photosensitive layer is a solder mask.

3. A system for forming bumps on an integrated circuit substrate according to claim 1 and wherein said direct laser imager defines exposed regions having a spatial density which exceeds a spatial density which is realizable using an exposure mask.

4. A system for forming bumps on an integrated circuit substrate according to claim 1 and wherein said direct laser imager defines exposed regions of said photosensitive layer to produce apertures having walls whose perpendicularity to a surface of the integrated circuit substrate exceeds the perpendicularity which realizable using an exposure mask.

5. A system for forming bumps on an integrated circuit substrate according to claim 1 and whereon said direct imager, said developer and said solder applicator operate waferwise prior to dicing of said integrated circuit substrate into individual dies.

6. A system for forming bumps on an integrated circuit substrate according to claim 2 and wherein said direct imager, said developer and said solder applicator operate waferwise prior to dicing of said integrated circuit substrate into individual dies.

7. A system for forming bumps on an integrated circuit substrate according to claim 1 and wherein said electrical circuit comprises an integrated circuit and said substrate comprises a semiconductor substrate.

8. A system for forming bumps on an integrated circuit substrate according to claim 1 and wherein said scanning laser direct imager comprises:
    a laser emitting laser light;
    a modulator receiving said laser light and modulating said laser light in accordance with control data received from a controller; and
    a polygonal mirror receiving said modulated laser and scanning said modulated laser light to expose said photoresist in a predetermined pattern.

9. A system for forming bumps on an integrated circuit substrate according to claim 1 and further comprising:
    a metal base applier applying metal bases overlying selected portions of said integrated circuit substrate and wherein said regions overly said bases.

10. A system for forming bumps on an integrated circuit substrate according to claim 9 and wherein said metal base applier comprises:
    a metal layer depositer depositing a metal layer on said substrate;
    a photoresist coater coating said metal layer with a photoresist;
    a laser direct imaging system selectively exposing said photoresist to define a multiplicity of locations;
    a developer developing said exposed photoresist and removing said photoresist other than at said locations, thereby to expose said metal layer other than at said locations;
    an etcher removing said metal layer other than at said locations to define a multiplicity of metal bases formed on said substrate.

11. A system for forming bumps on an integrated circuit substrate according to claim 9 and further comprising:
    a photosensitive layer coater coating said substrate and said metal bases thereon with a layer of photosensitive solder mask.

12. A system for forming bumps on an integrated circuit substrate according to claim 10 and wherein said scanning laser direct imaging system comprises:
    a laser emitting laser light;
    a modulator receiving said laser light and modulating said laser light in accordance with control data received from a controller; and
    a polygonal mirror receiving said modulated laser and scanning said modulated laser light to expose said photoresist in a predetermined pattern.

* * * * *